US007505846B2

(12) United States Patent
Stoecklein et al.

(10) Patent No.: US 7,505,846 B2
(45) Date of Patent: Mar. 17, 2009

(54) METHOD FOR OPERATING A FUEL INJECTION DEVICE OF AN INTERNAL COMBUSTION ENGINE

(75) Inventors: Wolfgang Stoecklein, Stuttgart (DE); Holger Rapp, Ditzingen (DE); Udo Schulz, Vaihingen/Enz (DE); Hideyuki Iwatsuki, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 108 days.

(21) Appl. No.: 11/795,228

(22) PCT Filed: Dec. 12, 2005

(86) PCT No.: PCT/EP2005/056668

§ 371 (c)(1), (2), (4) Date: Jul. 13, 2007

(87) PCT Pub. No.: WO2006/076992

PCT Pub. Date: Jul. 27, 2006

(65) Prior Publication Data

US 2008/0125952 A1 May 29, 2008

(30) Foreign Application Priority Data

Jan. 18, 2005 (DE) ...................... 10 2005 002 242

(51) Int. Cl.
*G06F 19/00* (2006.01)
*F02M 51/00* (2006.01)
*F02M 47/02* (2006.01)
*H01L 41/00* (2006.01)

(52) U.S. Cl. .................... 701/105; 123/490; 239/533.8; 310/316.01

(58) Field of Classification Search ................. 123/478, 123/480, 490, 500–502; 701/101–105, 112, 701/113, 115; 239/88, 533.4, 533.8, 533.9, 239/585.1; 310/316.01–316.03, 328; 361/152–154; 251/129.06
See application file for complete search history.

(56) References Cited

U.S. PATENT DOCUMENTS

| | | | | | |
|---|---|---|---|---|---|
| 5,803,361 | A * | 9/1998 | Horiuchi et al. | ............... | 239/88 |
| 5,884,848 | A * | 3/1999 | Crofts et al. | ............. | 239/533.8 |
| 5,979,803 | A * | 11/1999 | Peters et al. | ............. | 239/533.8 |
| 6,285,116 | B1 * | 9/2001 | Murai et al. | ................ | 310/328 |
| 6,760,212 | B2 * | 7/2004 | Cheever et al. | ............. | 361/160 |
| 6,912,998 | B1 * | 7/2005 | Rauznitz et al. | ............. | 123/490 |
| 6,928,986 | B2 * | 8/2005 | Niethammer et al. | ....... | 123/467 |
| 6,978,770 | B2 * | 12/2005 | Rauznitz et al. | ............. | 123/498 |

FOREIGN PATENT DOCUMENTS

| | | |
|---|---|---|
| DE | 199 02 413 | 5/2000 |
| DE | 199 60 971 | 3/2001 |
| DE | 100 12 607 | 9/2001 |
| EP | 1 172 541 | 1/2002 |
| WO | WO 03/040534 | 5/2003 |

* cited by examiner

*Primary Examiner*—Willis R Wolfe, Jr.
(74) *Attorney, Agent, or Firm*—Kenyon & Kenyon LLP

(57) ABSTRACT

A fuel injection device of an internal combustion engine includes a piezoelectric actuator and a valve element that are coupled to one another. The valve element has a pressure stage. An increase in the force acting on the piezoelectric actuator is interpreted as an actual opening of the valve element, and/or a decrease in the force acting on the piezoelectric actuator is interpreted as an actual closing of the valve element, and that these be taken into account at least part of the time in the controlling of the piezoelectric actuator.

13 Claims, 4 Drawing Sheets

METHOD FOR OPERATING A FUEL INJECTION DEVICE OF AN INTERNAL COMBUSTION ENGINE

FIELD OF THE INVENTION

The present invention relates to a method for operating a fuel injection device of an internal combustion engine in which a piezoelectric actuator is coupled to a valve element of the fuel injection device, the valve element having a pressure stage. In addition, the present invention relates to a computer program, an electrical storage medium for a control and/or regulating device of an internal combustion engine, and a control and/or regulating device of an internal combustion engine.

BACKGROUND INFORMATION

A method of the type mentioned above is described in European Patent No. EP 1 172 541 A1. In the fuel injection device described, a valve element is provided in the form of a valve needle that can be opened or closed hydraulically by a pressure in a control chamber. The pressure in the control chamber is in turn influenced by a switching valve that is coupled to a piezoelectric actuator via a hydraulic coupler.

In addition, in a commercially available fuel injection device, the valve element is coupled to the piezoelectric actuator immediately (i.e., without the intermediate connection of a switching valve), likewise via a hydraulic coupler. Here, during the charging and discharging of the piezoelectric actuator, either the voltage curve of the piezoelectric actuator can be predetermined or a current curve is predetermined, which then results in a desired voltage at the end of the charging or discharging process. In the latter case, the predetermined current profile can additionally be scaled by a superposed voltage regulator, so that at least the voltage levels at the end of the charging or discharging process can be set by a closed control circuit.

Here, however, the voltage gradient cannot be set arbitrarily. On the one hand, it is limited by the maximum current of an output stage that controls the piezoelectric actuator, and on the other hand it is limited by the fact that when the voltage gradient is too high the danger exists that the resonance of the piezoelectric actuator will be excited, which can result in destruction, or at least damage, of the piezoelectric actuator.

In the conventional fuel injection device, the "voltage stroke" required for an actuation of the valve element, i.e., the difference between the initial voltage and the final voltage given a controlling of the piezoelectric actuator, increases given increasing fuel pressure acting on the valve element in the opening direction. Here, the fuel injection device is designed in such a way that, given a high fuel pressure, a large part of the available voltage stroke must be used up in order to open the valve element. After the opening, the valve element accelerates and moves until an equilibrium of forces prevails at the oppositely oriented pressure surfaces of the valve element. Given a high fuel pressure, this equilibrium point is not reached until the valve element is almost completely open.

Due to the described conditions, using the conventional fuel injection device it is difficult to inject very small quantities of fuel into a combustion chamber of an internal combustion engine. Such small injection quantities are desirable for pre-injections (pilot injection), for example.

SUMMARY

An object of the present invention is to enable the injection of the smallest possible quantities of fuel using a fuel injection device having direct coupling between the piezoelectric actuator and the valve element, with simultaneously stable operation of the fuel injection device; i.e., without oscillations or resonance problems.

In a fuel injection device of the type described above, this object is achieved in that an increase in the force acting on the piezoelectric actuator is interpreted as an actual opening of the valve element (actual beginning of injection), and/or a decrease in the force acting on the piezoelectric actuator is interpreted as an actual closing of the valve element (actual ending of injection), and is taken into account at least part of the time during the controlling of the piezoelectric actuator. With a computer program, an electrical storage medium, and a control and/or regulation device of the type named above, the object of the present invention may be correspondingly achieved.

A method according to an example embodiment of the present invention may enable a stable operation of a fuel injection device in which the valve element and the piezoelectric actuator are directly coupled, for very small injection quantities of down to 1 $mm^3$ per injection, with simultaneous very high fuel pressures. In addition, the method according to the present invention may also enable an increase in the metering precision for larger quantities of fuel, because the actual beginning of the injection and/or the actual ending of the injection is/are known, and can be taken into account during the controlling of the piezoelectric actuator.

The background of these advantages of the method according to the example embodiment of the present invention is the fact that in a valve element having a pressure stage an additional force acts on the valve element in the opening direction after the opening of the valve element or after a controlling of the piezoelectric actuator. Due to the direct coupling of the valve element to the piezoelectric actuator, this additional force also acts on the piezoelectric actuator. By acquiring the change in the force acting on the piezoelectric actuator, a point in time can be acquired at which the valve element actually opens (actual beginning of the injection) or at which the valve element closes (actual ending of the injection) during the operation of the fuel injection device. However, if the actual beginning or ending of the injection is known, the controlling of the piezoelectric actuator can be correspondingly adapted, and in this way the degree of precision in the introduction of fuel into a combustion chamber of the internal combustion engine can be significantly improved.

An advantageous development of the method according to an example embodiment of the present invention is distinguished in that a closing operation of the valve element is introduced dependent on the actual beginning of the injection. This permits a very precise realization of a desired duration of opening of the valve element. In this way, the metering precision can also be improved for partial-load and full-load operation of an internal combustion engine.

Using the method according to an example embodiment of the present invention, the smallest injection quantities can be realized if the sign of a signal or of a signal gradient with which the piezoelectric actuator is controlled is changed as soon as an actual beginning of an injection has been detected. Here, a signal gradient is for example a voltage gradient, or, even more effectively, a current with which the piezoelectric actuator is charged or discharged is used as a signal. Because the change in sign, or the switching over from discharging to charging or vice versa, is regulated on the basis of a detected actual beginning of an injection of the valve element, the smallest quantity of fuel can also be represented in a very stable fashion.

A further advantageous embodiment of a method according to an example embodiment of the present invention is distinguished in that the actual beginning and/or actual end of the injection is regulated in accordance with a target value. This is because, differing from conventional methods, the beginning and/or ending of the controlling of the piezoelectric actuator are no longer regulated; rather, the actual beginning of the injection and/or actual end of the injection are regulated, resulting not only in a precise metering of a desired quantity of fuel, but also in a precise realization of a desired time of the injection. At the same time, a scattering of the delay time between the beginning of the controlling and the beginning of the injection, or between the end of the controlling and the end of the injection, is not permitted to affect the fuel metering.

Here, a difference between the actual beginning of the injection and the actual end of the injection (actual duration of the injection) can also be regulated in accordance with a target value. In this case, the precision of the fuel metering is even better.

Another advantageous embodiment of the method according to an example embodiment of the present invention provides that a change in the force acting on the piezoelectric actuator is acquired via a change in an electrical quantity, influenced by the force, of the piezoelectric actuator. This is based on the idea that the change in force acting on the piezoelectric actuator will cause a change in its length. In operation with a predetermined expansion curve—i.e., an "impressed" current curve—this results in a change in the voltage curve, and, in operation with an "impressed" voltage curve, this results in a change in the actuator current curve. According to the present invention, this change can be acquired unproblematically, so that an actual beginning or actual end of the injection can be acquired without requiring an additional sensor.

One development of this variant of the method provides that in order to open the valve element the piezoelectric actuator is discharged or charged with a predetermined voltage curve, and that an actual beginning of the injection is recognized if a discharge current, or a charge current, exceeds or falls below a boundary value, this boundary value being formed by the product of a capacitance constant of the piezoelectric actuator and the discharge or charge voltage gradient. This method is very simple to realize.

The same is true for the variant method in which, in order to open the valve element, the piezoelectric actuator is discharged or charged with a predetermined current curve, and in which an actual beginning of an injection is recognized if a discharge or charge voltage gradient exceeds or falls below a boundary value, the boundary value being formed by the quotient of the discharge or charge current and a capacitance constant of the piezoelectric actuator.

In the two latter method variants, knowledge of the charge and discharge strategy in use is required. Independent of such a strategy is a method in which for the opening of the valve element the piezoelectric actuator is discharged or charged, and in which a perturbation quantity detector is used to estimate a current portion that results from the increase in the force acting on the piezoelectric actuator, and in which an actual beginning of an injection is recognized when the current portion exceeds a boundary value. As a perturbation quantity detector, a Luenberger detection method may for example be used.

All three of the latter method variants can be used not only to recognize an actual beginning of an injection, but also, in a corresponding manner, to recognize an actual end of an injection, with correspondingly adapted different boundary values.

BRIEF DESCRIPTION OF THE DRAWINGS

Below, exemplary embodiments of the present invention are explained in detail with reference to the accompanying figures.

DESCRIPTION OF EXAMPLE EMBODIMENTS

Figure 1:
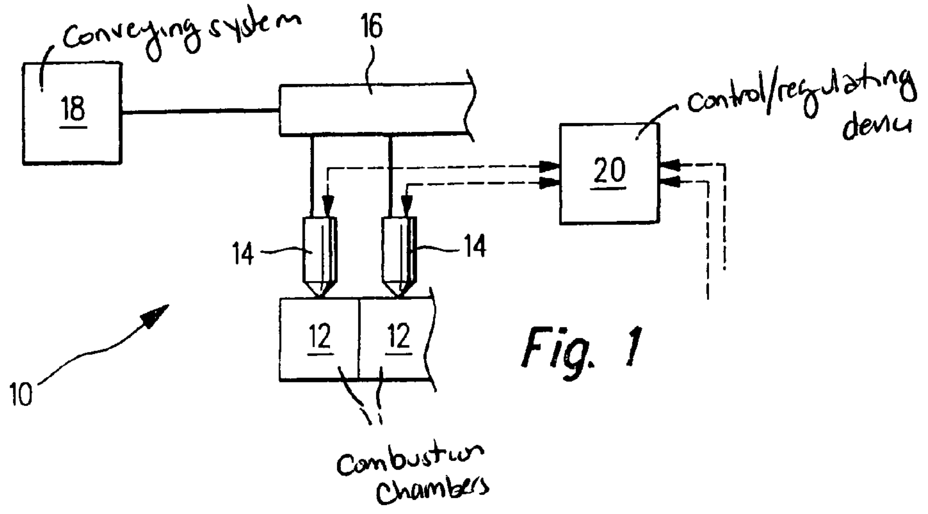
FIG. 1 shows a schematic representation of an internal combustion engine having a plurality of fuel injectors.

In FIG. 1, an internal combustion engine is designated as a whole by reference character 10. It has a plurality of combustion chambers 12 into which fuel is injected directly by a respective fuel injector 14. Fuel injectors 14 are connected to a fuel pressure storage device (rail) 16, into which the fuel is conveyed by a conveying system 18. The operation of fuel injectors 14 is controlled or regulated by a control and/or regulating device 20 (dashed lines). For this purpose, inter alia input signals (dashed lines) from various sensors are used that are not shown in FIG. 1.

Figure 2:
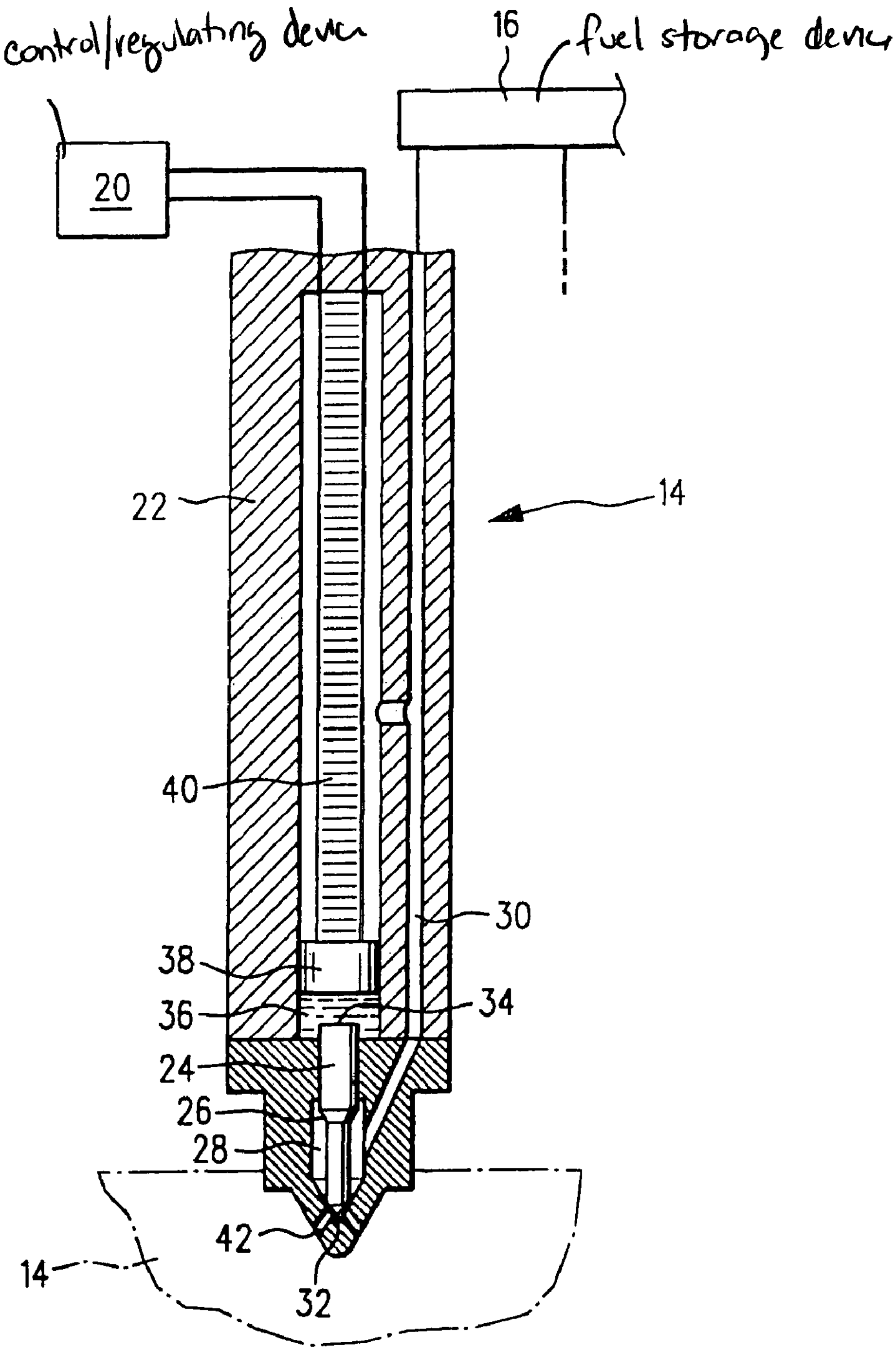
FIG. 2 shows a partial section through a fuel injector of FIG. 1.

As can be seen in FIG. 2, fuel injector 14 has a housing 22 in which a needle-type valve element 24 is housed so as to be capable of longitudinal displacement. This valve element has a pressure shoulder 26 that acts in the direction of opening and that is situated in a pressure chamber 28 that is connected via a duct 30 to fuel storage device 16. A conical pressure surface 32, likewise acting in the direction of opening, is separated fluidically from pressure chamber 28 in the closed state of the valve element.

The end of valve element 24 situated opposite pressure surface 32 protrudes with a surface 34 into a hydraulic control chamber 36 in which the high pressure of the fuel pressure storage device prevails. Control chamber 36 is also limited by a control piston 38 whose diameter, in the present exemplary embodiment, is greater than control surface 34 of valve element 24. Control piston 38 is fastened to a piezoelectric actuator 40 that is controlled by control and/or regulating device 20, possibly with the intermediate connection of an output stage (not shown in FIG. 2).

In order for fuel injector 14 to inject fuel into combustion chamber 12, piezoelectric actuator 40 is controlled in such a way that its length decreases. As a consequence, control piston 38 in FIG. 2 moves upward. Via the hydraulic coupling by control chamber 36, and due to the force acting on the pressure shoulder in the direction of opening, valve element 24 also moves upward. As a consequence, the high fuel pressure prevailing in pressure chamber 28 is also applied to end-side pressure surface 32 of valve element 24, which, after the first opening movement of valve element 24, results in an additional force acting in the opening direction and in an accelerated opening of valve element 24.

Figure 3:
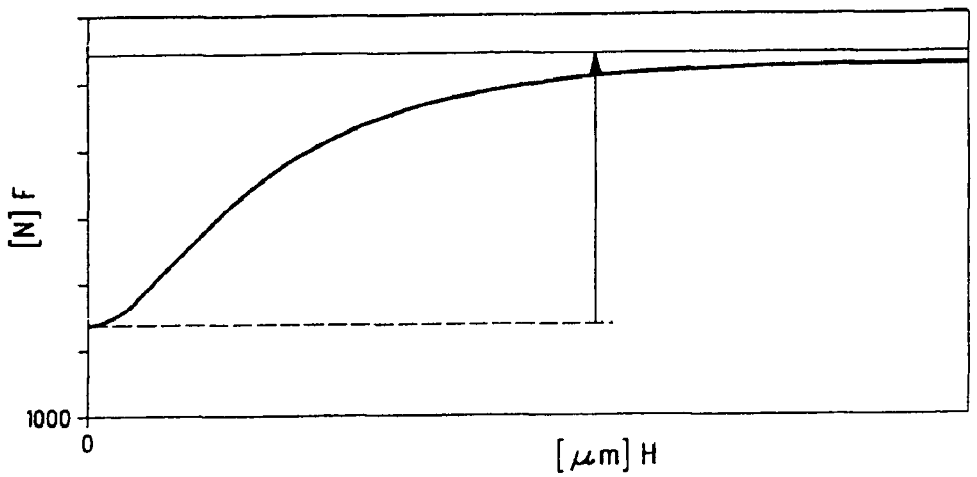
FIG. 3 shows a diagram in which a force acting in the direction of opening is plotted over a stroke of a valve element of a fuel injector of FIG. 2.

Because the force acting on valve element 24 in the opening direction increases quickly after the opening, this is also referred to as a valve element having a "pressure stage." The increase in the force F acting on valve element 24 in the opening direction can also be seen in FIG. 3, where this force is plotted over an opening stroke H. Fuel can now move into combustion chamber 12 through fuel outlet ducts 42.

Figure 4:
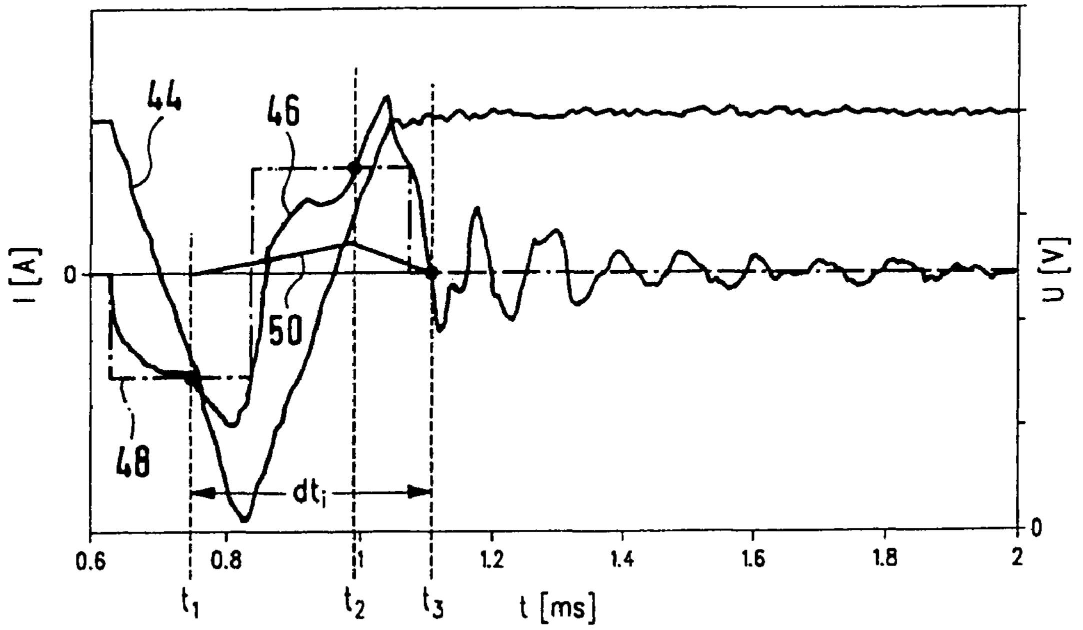
FIG. 4 shows a diagram in which various operating parameters of a fuel injector of FIG. 2 during an injection process are plotted over time.

In order to enable the injection of even very small quantities of fuel using fuel injector 14, a method is used that is now explained with reference to FIG. 4:

In the present exemplary embodiment, piezoelectric actuator 40 is charged if valve element 24 is supposed to be closed. In order to open valve element 24, piezoelectric actuator 40 is discharged. Here, in the present exemplary embodiment piezoelectric actuator 40 is charged or discharged with a particular voltage curve, which in the present case is generally linear. For this purpose, during the discharging and the charging the voltage curve, or voltage gradient, is measured, and the charge or discharge current is set correspondingly. A charge Q of the piezoelectric actuator can be expressed in simplified form as the sum of a voltage-dependent portion $Q_u=C_0 \cdot U$ and a length-dependent portion $Q_x=C_x \cdot (x-x_0)$. Here, factors $C_0$ and $C_x$ are capacitance constants, U is a voltage adjacent to the actuator, and x is a momentary length of piezoelectric actuator 40.

Length-dependent portion $Q_x$ is based on the following consideration: the force acting in the opening direction on valve element 24 is also transmitted to piezoelectric actuator 40 via the hydraulic coupling of pressure chamber 28 and control piston 38. If valve element 24 opens, due to the pressure stage on valve element 24 this also results in an increase in pressure (pressure jump) at piezoelectric actuator 40. This pressure jump results in an additional change in length of piezoelectric actuator 40. In order to maintain the predetermined voltage curve even given the boundary condition of the increased speed of change of length of piezoelectric actuator 40, discharge current i must be increased in relation to the state in which valve element 24 is at rest. In the method used here, this pressure jump and the corresponding change in charge are used to acquire an actual opening of valve element 24 (injection beginning), or an actual closing of valve element 24 (injection end). For this purpose, the following physical principles are used:

$$Q=\int i\,dt=Q_u+Q_x=C_0 \cdot u+C_x \cdot (x-x_0) \tag{1}$$

Solved for the discharge or charge current of piezoelectric actuator 40, this yields:

$$i = i_u + i_x = \frac{dQ_u}{dt} + \frac{dQ_x}{dt} = C_0 \cdot \frac{du}{dt} + C_x \cdot \frac{dx}{dt} \tag{2}$$

From this there results:

$$\frac{dx}{dt} = \frac{1}{C_x} \cdot \left(i - C_0 \cdot \frac{du}{dt}\right) \tag{3}$$

If, during discharging, discharge current i clearly falls below the boundary value $C_0 \cdot du/dt$, this means that valve element 24 is opening at that moment. If, during the charging of piezoelectric actuator 40, charge current i exceeds this value, the direction of motion of valve element 24 is changing at that moment. If, during charging, the charge current falls below this value, valve element 24 is in the process of closing. In FIG. 4, the voltage U at piezoelectric actuator 40 is designated 44, current i is designated 46, boundary value $C_0 \cdot du/dt$ is designated 48 (dash-dot curve), and a stroke H of valve element 24 is designated 50. The beginning of the injection takes place at time $t_1$, the change of direction of valve element 24 takes place at time $t_2$, and the end of the injection takes place at time $t_3$.

Dependent on the acquired beginning of the injection of fuel injector 14 at time $t_1$, piezoelectric actuator 40 is closed again as quickly as possible by control and/or regulating device 20. For this purpose, after an acquired beginning of an injection $t_1$ discharge current i is changed in such a way that the gradient du/dt of voltage u has an opposite sign. The closing of valve element 24 is thus introduced in a manner dependent on the actual opening (beginning of the injection). Because on the basis of the indicated method the actual beginning of the injection and the actual end of the injection are able to be acquired at times $t_1$ and $t_3$, these can be regulated respectively in accordance with a target value. It is also possible to regulate the actual beginning of the injection at time $t_1$ and a difference $dt_1$, also called the actual injection duration, in accordance with a target value.

Finally, fuel injector 14, or piezoelectric actuator 40, can also be charged and discharged with a predetermined particular curve of charge current or discharge current i. From equation (1) above, the following then results:

$$\frac{du}{dt} = \frac{1}{C_0} \cdot \frac{dQ_u}{dt} = \frac{1}{C_0} \cdot \left(i - \frac{dQ_x}{dt}\right) = \frac{1}{C_0} \cdot \left(\left(i - C_x \cdot \frac{dx}{dt}\right)\right. \tag{4}$$

$$\frac{dx}{dt} = \frac{1}{C_x} \cdot \frac{dQ_x}{dt} = \frac{1}{C_x} \cdot \left(i - \frac{dQ_u}{dt}\right) = \frac{1}{C_x} \cdot \left(i = C_0 \cdot \frac{du}{dt}\right) \tag{5}$$

If in this case the voltage gradient du/dt during discharging is clearly greater than the value $i/C_0$, valve element 24 is in the process of opening. If the voltage gradient du/dt falls below this value, valve element 24 is in the process of closing.

Figure 5:
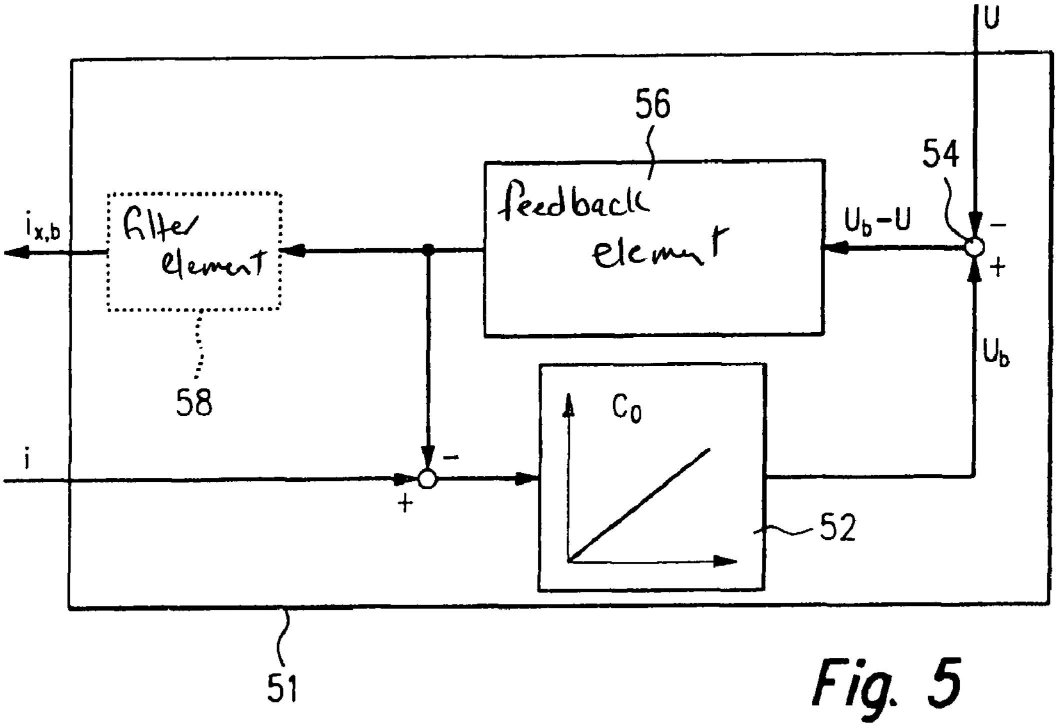
FIG. 5 shows a functional illustration of a first example method for operating a fuel injector of FIG. 2.

The beginning of the injection and the end of the injection can however also be determined independent of the charge and discharge strategy, i.e., independent of whether a particular voltage curve or a particular current curve are predetermined. This takes place with the aid of a disturbance observer 51, e.g., a Luenberger detection method (cf. FIG. 5). Integration of the equation $$\frac{du}{dt} = \frac{1}{C_0} \cdot \frac{dQ_u}{dt} = \frac{1}{C_0} \cdot \left(i - \frac{dQ_x}{dt}\right) = \frac{1}{C_0} \cdot \left(\left(i - C_x \cdot \frac{dx}{dt}\right)\right. \tag{6}$$

yields $$u = \frac{1}{C_0} \cdot \int \left(i - C_x \cdot \frac{dx}{dt}\right) dt = \frac{1}{C_0} \cdot \int \left(i - \frac{dQ_x}{dt}\right) dt = \frac{1}{C_0} \cdot \int (i - i_x) dt \tag{7}$$

Equation (7) can be understood as the transmission path, of whose input quantities, however, only the current i can be measured. However, current quantity i, which is dependent on the change in length of piezoelectric actuator 40 or on the increase of force during the opening of valve element 24, cannot be measured. In order to determine this quantity, first the charge or discharge current i, known in control and/or regulating device 20, is supplied to a path simulation unit (block 52 in FIG. 5). In the exemplary embodiment shown in FIG. 5, this path simulation unit is made up of an integrator having integration constant $C_0$, or having a time constant calculated by norming from integration constant $C_0$. The output quantity of this integrator 52 is an observed voltage $u_b$ at piezoelectric actuator 40.

If the quantity $i_x=0$, then $u_b=u$. If, however, piezoelectric actuator 40 changes its length during the opening or closing of valve element 24, and as a result $i_x \neq 0$, then $u_b$ and u differ from one another. In 54, the difference between $u_b$ and the measured voltage u is determined, and is supplied to a feedback element 56. This can for example be a simple proportional amplifier or a PI element, but can also be an amplifier having a second-order or higher-order transmission characteristic.

The output signal of feedback element 56 is then connected to the input of path simulation unit 52 with a negative sign. This output signal now follows the unknown quantity $i_x$ corresponding to the transmission characteristic of observer 51, and can be used, either directly or via an additional filter element 58, as observed signal $i_{x,b}$ for unknown quantity $i_x$.

If during discharging the signal $i_{x,b}$ falls below a defined threshold, an opening of valve element 24 is detected; if during charging it exceeds a second defined threshold, the beginning of the closing operation of valve element 24 is detected. If after the end of the charging process it falls below this second threshold or below an additional, third threshold, this is acquired as the end of the injection.

Figure 6:
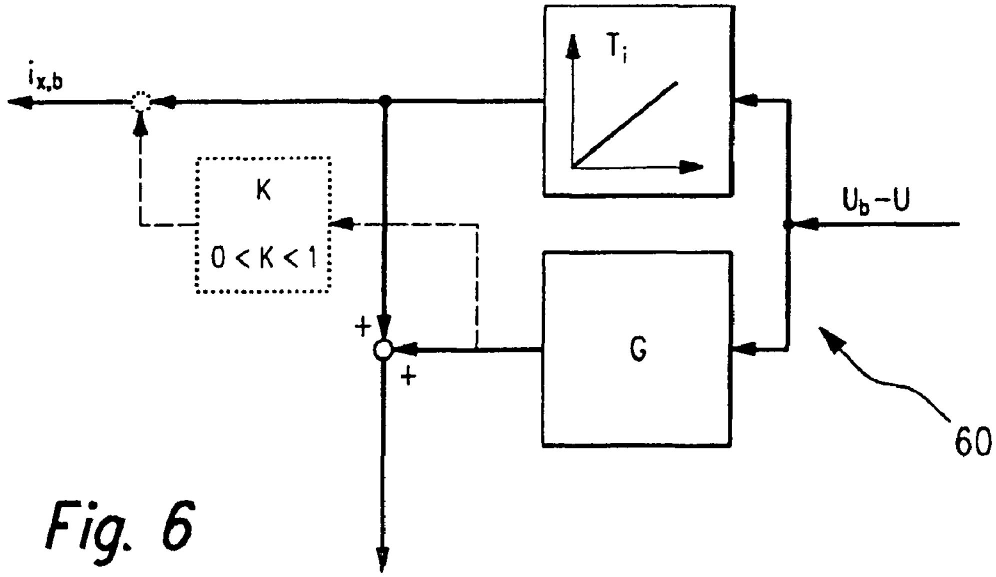
FIG. 6 shows a functional illustration of a second example method for operating a fuel injector of FIG. 2.

As can be seen in FIG. 6, the feedback element and filter element 52 can be combined to form a unit 60. For this purpose, the filtered signal is formed from weighted components of the output signal of the feedback element. For the example of a PI element as feedback element 56, this can be illustrated as follows: for example, as observed signal $i_{x,b}$, instead of the output signal of feedback element 56 it is also possible to use only its I portion, or the sum of the I portion and the P portion multiplied by a factor K, K being between 0 and 1. This corresponds to a filtering of the output signal using a first-order delay element.

Figure 7:
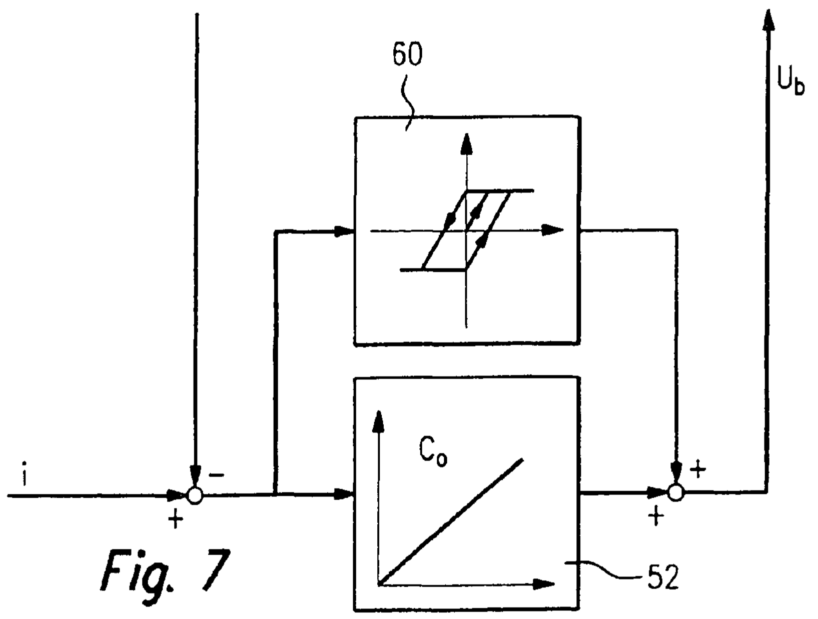
FIG. 7 shows a functional illustration of a third example method for operating a fuel injector of FIG. 2.

The path simulation unit of piezoelectric actuator 40 can, as is shown below, be matched more precisely to the real characteristic thereof: thus, for example a non-linear behavior of piezoelectric actuator 40 is simulated by an integrator 52 that is non-linear in the same manner, and/or hysteresis effects can be taken into account by inserting a hysteresis element 60 into the path simulation unit (cf. FIG. 7).

Here it is to be noted that the above-indicated methods are stored on a storage unit of control and/or regulating device 20, in the form of a computer program.

What is claimed is:

1. A computer program, the computer program, when executed by a computer, causing the computer to perform the following steps:

controlling a fuel injection device of an internal combustion engine, the engine having a piezoelectric actuator coupled to a valve element of the fuel injection device, the valve element having a pressure stage, the controlling step including:

interpreting as an actual closing of the valve element at least one of: i) an increase in a force acting on the piezoelectric actuator as an actual opening of the valve element (actual injection beginning), and ii) a decrease in the force acting on the piezoelectric actuator; and taking the at least one of the increase in force and decrease in force into account at least intermittently during control of the piezoelectric actuator.

2. An electrical storage medium for a control and/or regulating device of an internal combustion engine, the electrical storage medium storing a computer program, the computer program, when executed by a computer, causing the computer to perform the following steps:

interpreting as an actual closing of the valve element at least one of: i) an increase in a force acting on the piezoelectric actuator as an actual opening of the valve element (actual injection beginning), and ii) a decrease in the force acting on the piezoelectric actuator; and taking the at least one of the increase in force and decrease in force into account at least intermittently during control of the piezoelectric actuator.

3. A control and/or regulating device for an internal combustion engine, the engine having a piezoelectric actuator coupled to a valve element of the fuel injection device, the valve element having a pressure stage, the control device comprising:

a controller configured to interpret as an actual closing of the valve element at least one of: i) an increase in a force acting on the piezoelectric actuator as an actual opening of the valve element (actual injection beginning), and ii) a decrease in the force acting on the piezoelectric actuator, the controller further configured to take the at least one of the increase in force and decrease in force into account at least intermittently during control of the piezoelectric actuator.

4. A method for operating a fuel injection device of an internal combustion engine, the engine having a piezoelectric actuator coupled to a valve element of the fuel injection device, the valve element having a pressure stage, the method comprising:

interpreting as an actual closing of the valve element at least one of: i) an increase in a force acting on the piezoelectric actuator as an actual opening of the valve element (actual injection beginning), and ii) a decrease in the force acting on the piezoelectric actuator; and taking the at least one of the increase in force and decrease in force into account at least intermittently during control of the piezoelectric actuator.

5. The method as recited in claim 4, wherein at least one of the actual injection beginning and the actual injection ending are regulated in accordance with a target value.

6. The method as recited in claim 4, wherein a difference between the actual injection beginning and the actual injection ending is regulated in accordance with a target value.

7. The method as recited in claim 4, wherein to open the valve element, the piezoelectric actuator is discharged or charged with a predetermined current curve, and an actual injection beginning is detected if a discharge or charge voltage gradient exceeds or falls below a boundary value, the boundary value being formed by a quotient of the discharge or charge current and a capacitance constant of the piezoelectric actuator.

8. The method as recited in claim 4, wherein to open the valve element, the piezoelectric actuator is discharged or charged, and using a disturbance observer, a current portion is estimated that results from the increase of the force acting on the piezoelectric actuator, and an actual injection beginning is detected if a current portion exceeds a boundary value.

9. The method as recited in claim 4, further comprising: detecting an actual injection end.

10. The method as recited in claim 4, wherein a closing operation of the valve element is introduced as a function of the actual injection beginning.

11. The method as recited in claim 10, wherein a sign of a signal by which the piezoelectric actuator is controlled or of a signal gradient by which the piezoelectric actuator is controlled, is changed as soon as the actual injection beginning has been detected.

12. The method as recited in claim 4, wherein a change in the force acting on the piezoelectric actuator is detected via a change in an electrical quantity, influenced by the force, of the piezoelectric actuator.

13. The method as recited in claim 12, wherein to open the valve element, the piezoelectric actuator is discharged or charged with a predetermined voltage curve, and an actual injection beginning is detected when a discharge current or a charge current exceeds or falls below a boundary value, the boundary value being formed by the product of a capacitance constant of the piezoelectric actuator and a gradient of the discharge or charge voltage.

* * * * *